(12) United States Patent
Lin

(10) Patent No.: US 10,804,628 B1
(45) Date of Patent: Oct. 13, 2020

(54) CONNECTOR FOR CLOTHING

(71) Applicant: Jao Ching Lin, Taipei (TW)

(72) Inventor: Jao Ching Lin, Taipei (TW)

( * ) Notice: Subject to any disclaimer, the term of this patent is extended or adjusted under 35 U.S.C. 154(b) by 0 days.

(21) Appl. No.: 16/546,347

(22) Filed: Aug. 21, 2019

(51) Int. Cl.
| | |
|---|---|
| *H01R 12/71* | (2011.01) |
| *H05K 1/11* | (2006.01) |
| *H01R 13/24* | (2006.01) |
| *H01R 13/502* | (2006.01) |
| *H01R 13/6591* | (2011.01) |
| *H01R 13/6581* | (2011.01) |

(52) U.S. Cl.
CPC .......... *H01R 12/714* (2013.01); *H01R 13/24* (2013.01); *H01R 13/502* (2013.01); *H01R 13/6581* (2013.01); *H01R 13/6591* (2013.01); *H05K 1/119* (2013.01); *H05K 2201/09027* (2013.01); *H05K 2201/0939* (2013.01); *H05K 2201/09445* (2013.01)

(58) Field of Classification Search
CPC .. H01R 12/7017; H01R 12/714; H01R 13/24; H01R 13/502; H01R 13/5025; H01R 13/506; H01R 13/6581; H01R 13/6582; H01R 4/48; H01R 4/4809; H01R 4/52; H05K 1/119; H05K 2201/09027; H05K 2201/0939; H05K 2201/09445; A41D 1/002; A41D 1/005
USPC .......................................................... 439/37
See application file for complete search history.

(56) References Cited

U.S. PATENT DOCUMENTS

| | | | | |
|---|---|---|---|---|
| 3,808,577 | A * | 4/1974 | Mathauser | H01R 13/6205 439/39 |
| 5,035,650 | A * | 7/1991 | Defibaugh | H01R 13/6582 439/607.17 |
| 6,319,015 | B1 * | 11/2001 | Faunce | H01R 11/22 24/662 |
| 9,882,308 | B1 * | 1/2018 | Yi | H01R 13/62938 |
| 2007/0123089 | A1 * | 5/2007 | Nishio | H01R 13/639 439/342 |
| 2009/0142957 | A1 * | 6/2009 | DeMonica | H01R 13/506 439/527 |
| 2010/0100997 | A1 * | 4/2010 | Lee | H01R 13/2407 2/69 |
| 2015/0349457 | A1 * | 12/2015 | Shariff | H01R 13/6205 439/37 |
| 2016/0181729 | A1 * | 6/2016 | Barth | A44B 17/0064 439/37 |

(Continued)

*Primary Examiner* — Oscar C Jimenez
(74) *Attorney, Agent, or Firm* — Karin L. Williams; Mayer & Williams PC

(57) ABSTRACT

A connector for clothing includes a first substrate and a first connector being mounted on the first substrate. The first connector includes a first conductive metallic case with a first bottom portion surrounded by an annular first side portion. At least two first wire through holes are configured to the first side portion. A first wire module including at least three first wires and at least one ground wire is configured to the first connector. Three first wires are passed through one of the first wire through hole and the ground wire is electrically connected with a surface of the first case. A first circular board is configured inside but insulated from the first case. At least three first electric junctions are electrically attached on a surface of the first circular board and each first wire is electrically connected with each first electric junction.

3 Claims, 3 Drawing Sheets

(56) References Cited

U.S. PATENT DOCUMENTS

2020/0022425 A1\* 1/2020 Hashiguchi .............. H01R 4/58
2020/0059038 A1\* 2/2020 Wimmer ............ H01R 13/6275

\* cited by examiner

CONNECTOR FOR CLOTHING

FIELD OF INVENTION

The present invention is related to a connector, especially to a connector that can be integrated on clothing with a ground wire and has an ability to eliminate or resist signal interference.

BACKGROUND OF THE INVENTION

Techniques of wearable electronic devise have been rapidly developed, especially incorporating wearable electronic device and clothing attached with certain connectors, detectors or transmitters (also called smart clothing) by wired or wireless means. An electronic device can receive data or signals transmitted from the smart clothing and achieve certain purposes, like body temperature monitoring, heart rate monitoring or even detecting posture for athletes. This draws more and more attention toward many developers in the market.

However, in order to achieve multiple functions of smart clothing, different types of connectors, detectors or transmitters will be attached to the clothing which may cause signal interference between each connector, detector or transmitter. Hence, it is necessary to have a connector for clothing that will overcome or substantially ameliorate at least one or more of the deficiencies of the prior art, or at least provide an alternative solution to the problems of the prior art.

It is to be understood that, if any prior art information is referred to herein, such reference does not constitute an admission that the information forms part of the common general knowledge in the art.

SUMMARY OF THE INVENTION

In order to solve shortcomings of conventional smart clothing where the signal of a connector can be easily interfered, the present invention is required.

The present invention is related to a connector for clothing includes a first substrate and a first connector being mounted on the first substrate. The first connector includes a first conductive metallic case with a first bottom portion surrounded by an annular first side portion. At least two first wire through holes are configured to the first side portion. A first wire module includes at least three first wires and at least one ground wire which is configured to the first connector. Three first wires are passed through one of the first wire through hole and the ground wire is electrically connected with a surface of the first case. A first circular board is configured inside but insulated from the first case. At least three first electric junctions are electrically attached on a surface of the first circular board and each first wire is electrically connected with each first electric junction.

When using the present invention, the first substrate may be a part of a fabric of smart clothing. The first connector is attached to the smart clothing and can be electrically connected with other connector with corresponded structure. The first electric junctions of the first connector will be selectively connected with electric junctions of another connector. Hence, the smart clothing is able to be communicated or transmitted signals with the other electronic device.

According to above description, the present invention can be functioned as a normal button on clothing which is suitable for all kinds of clothing without affecting its design or appearance. The ground wire of the present invention can quickly eliminate or remove outside interference and lead to a steadier signal transmitting for the present invention.

Many of the attendant features and advantages of the present invention will become better to understood with reference to the following detailed description considered in connection with the accompanying figures and drawings.

BRIEF DESCRIPTION OF THE DRAWINGS

The steps and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
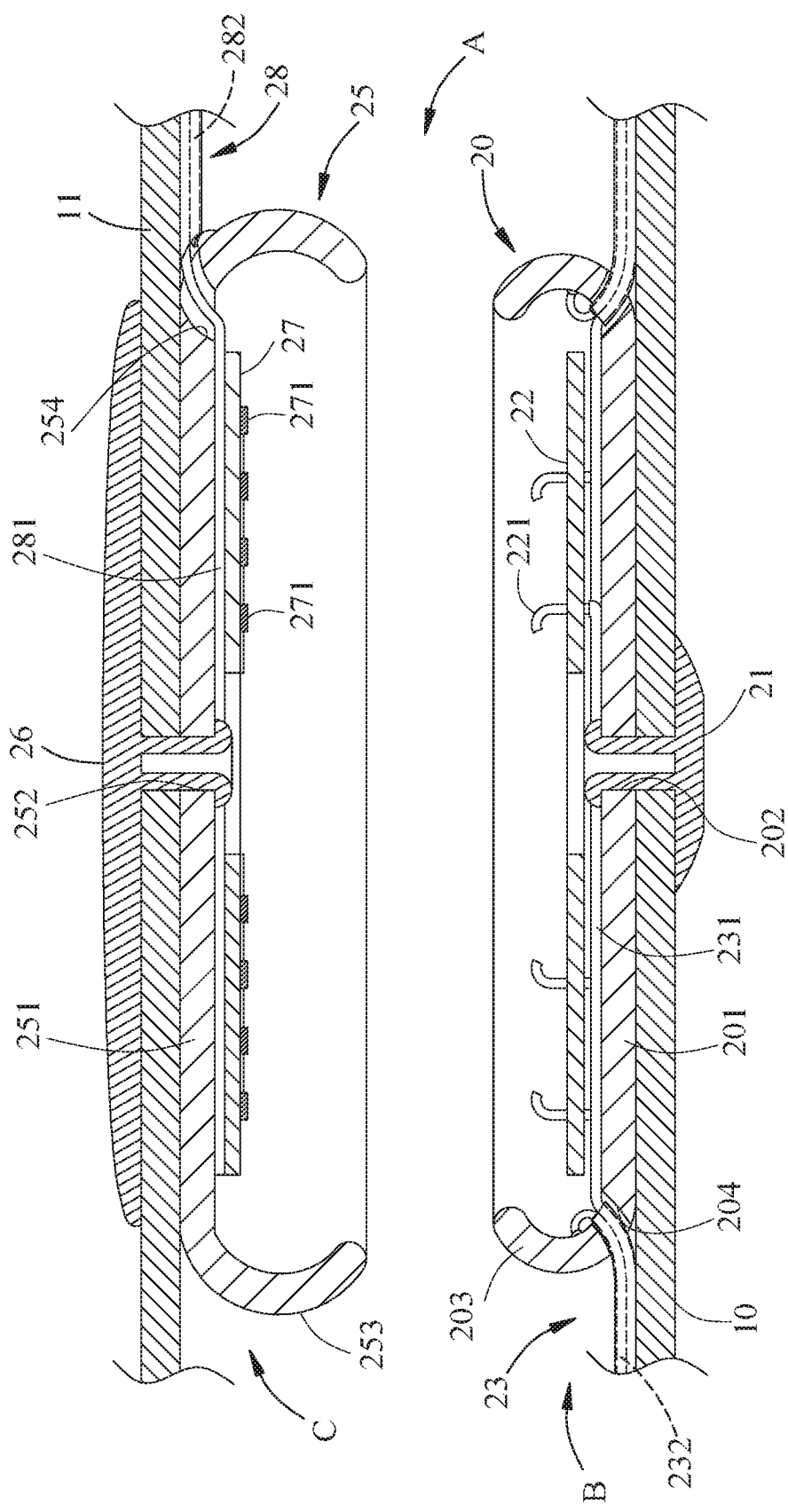
FIG. 1 is a cross-section view of the first connector and the second connector in accordance with the present invention.

Reference will now be made in detail to the present preferred embodiments of the invention, examples of which are illustrated in the accompanying drawings. Wherever possible, the same reference numbers are used in the drawings as well as the description in order to refer to the same or similar parts. It is not intended to limit the method by the exemplary embodiments described herein. In the following detailed description, for purposes of explanation, numerous specific details are set forth in order to attain a thorough understanding of the disclosed embodiments. It will be apparent, however, that one or more embodiments may be practiced without these specific details. As used in the description herein and throughout the claims that follow, the meaning of "a", "an", and "the" may include reference to the plural unless the context clearly dictates otherwise. Also, as used in the description herein and throughout the claims that follow, the terms "comprise or comprising", "include or including", "have or having", "contain or containing" and the like are to be understood as open-ended, i.e., to mean including but not limited to.

Figure 2:
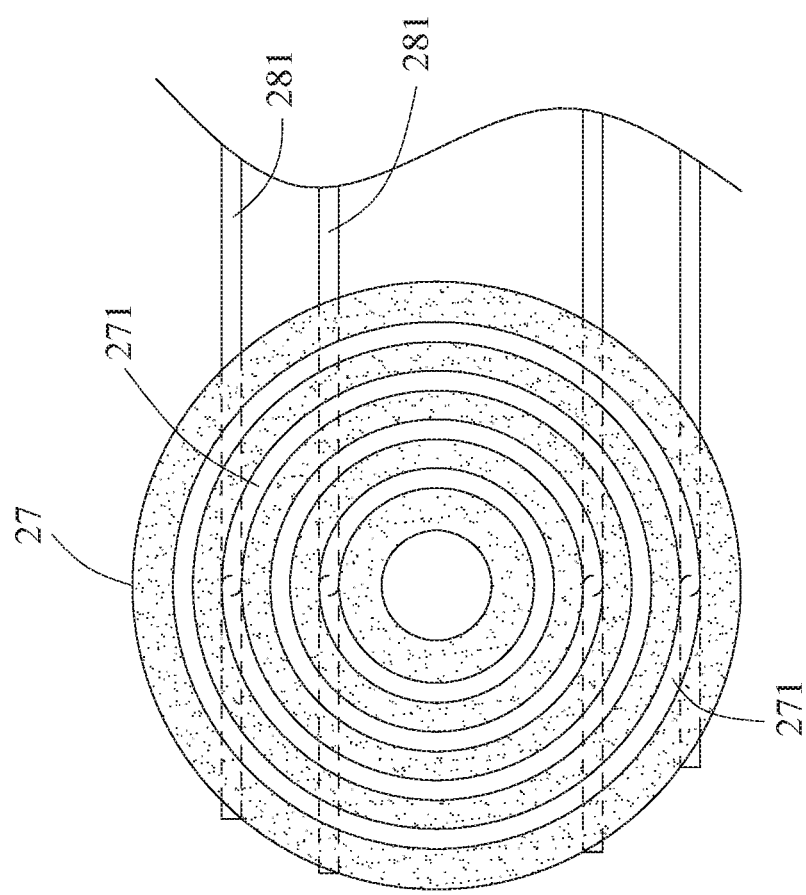
FIG. 2 is a bottom view of the second circuit board and the second conducted wire in accordance with to present invention.
Figure 3:
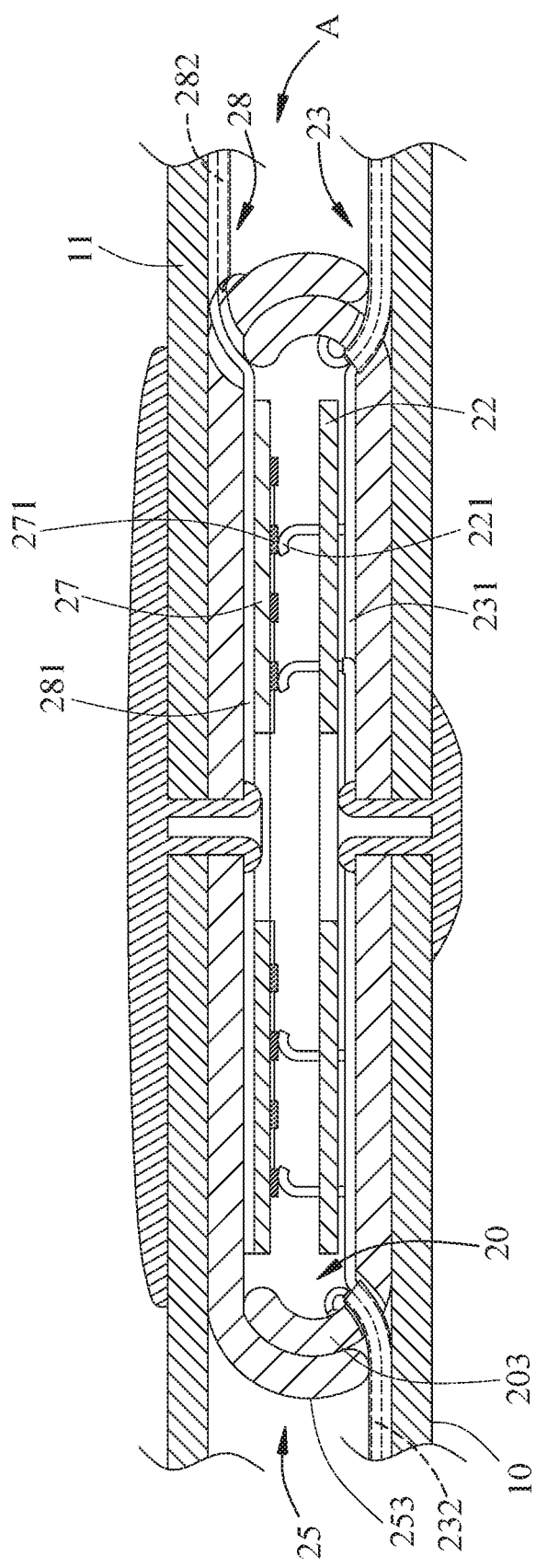
FIG. 3 is a cross-section view of the connected first connector and the second connector in accordance with the present invention.

With reference to FIG. 1 to FIG. 3, the present invention is a connector for clothing A having a first connector B and a second connector C. The first connector B is mounted on a first substrate 10 and the second connector C is mounted on a second substrate 11. The first connector B is removably electronic connected with the second connector C.

The first connector B has a first case 20 mounted on the first substrate 10. In this embodiment, the first case 20 is a conductive metallic button (or also can call it "a plate shape"). The first case 20 has a first bottom portion 201 with a first fixation through hole 202 configured to its center. The first bottom portion 201 is connected with and surrounded by an annular first side portion 203 to form the plate-shaped button of the first case 20. With reference to FIG. 1, a cross-section view of the first side portion 203 is preferred to be in a C shape where ends of the first side portion 203 are curved inwardly. At least two first wire through holes 204 are configured to the first side portion 203, more preferably configured to a bottom edge of the first side portion 203. The first connector B is mounted on the first substrate 10 by a first fixing element 21 through the first fixation through hole 202. The first fixing element 21 may be a rivet.

At least one first wire module 23 is configured to the first connector B. Each first wire module 23 includes at least three first wires 231 and at least one first ground wire 232. In this embodiment, there are two first wire modules 23 being configured to the first connector B and each first wire module 23 includes four first wires 231 passed through one of the first wire through hole 204 and one first ground wire 232 being electrically connected with a surface of the first case 20. The first wires 231 came from each first wire module 23 are configured to the first connector B through the two first wire through holes 204 respectively. The first ground wire 232 is electrically connected with the first case 20 with or without passing through the first wire through holes 204.

A first circular board 22 is configured inside but insulated from the first case 20, more preferably, the first circular board 22 is concentrically configured to the first case 20. Each first wire 231 of each first wire module 23 is electrically attached with the first circular board 22 by adhesion or hooking. The first wires 231 and the first circular board 22 are fixed on the first bottom portion 201. At least three first electric junction 221 are configured to be attached on a surface of the first circular board 22. The number of the first electric junction 221 correspond to the number of the first wires 231 of each first wire module 23. The first electric junction 221 may be a hook like metal film with elastic properties (or can be bended). In this embodiment, there has four electric junctions 221 attached on the first circular board 22 and each electric junction 221 is attached to the circular board and has different distances toward a center of the first circular board 22. In this embodiment, one of the first wires 231 from the two first wire modules 23 are electrically connected to the same first electric junction 221 to form an electrical pathway.

The second connector C has a second case 25 mounted on the second substrate 11. The second case 25 is also a conductive metallic button (or "a plate shape"). The second case 25 has a second bottom portion 251 with a second fixation through hole 252 configured to its center. The second bottom portion 251 is connected with and surrounded by an annular second side portion 253 to form the plate-shaped button of the second case 25. With reference to FIG. 1, a cross-section view of the second side portion 253 is preferred to be in a C shape where ends of the second side portion 253 are curved inwardly. A shape of the second case 25 corresponds to the first case 20 but slightly smaller. Hence, the second case 25 is able to be fastened with the first case 20 like a pair of male and female button. At least one second wire through hole 254 is configured to the second side portion 253, more preferably configured to a bottom edge of the second side portion 253. The second connector C is mounted on the second substrate 11 by a second fixing element 26 through the second fixation through hole 252. The second fixing element 26 may be a rivet.

The second wire module 28 is configured to the second connector C comprising at least three second wires 281 and at least one second ground wire 282. In this embodiment, the second wire module 28 includes four second wires 281 passed through the second wire through hole 254 and one second ground wire 282 being electrically connected with a surface of the second case 25. The second wires 281 of the second wire module 28 are configured to the second connector C through the second wire through hole 254. The second ground wire 282 is electrically connected with the second case 25 with or without passing through the second wire through hole 251.

A second circular board 27 is configured inside but insulated from the second case 25, more preferably, the second circular board 27 is concentrically configured to the second case 25. The second wire 281 of the second wire module 28 is electrically attached with the second circular board 27 by adhesion or hooking. The second wires 281 and the second circular board 28 are fixed on the second bottom portion 251. With reference to FIG. 2, at least three second electric junctions 271 are configured to be attached with a surface of the second circular board 27. The number of the second electric junctions 271 correspond to the number of the second wires 281 of the second wire module 28. The second electric junctions 271 in this embodiment are annular electric foils where each second electric junction 271 is concentrically attached to the second circular board 28 and has different distances toward a center of the second circular board 28. Each second wire 281 of the second wire module 28 is electrically connected with each second electric junction 271. With reference to FIG. 3, each first electric junction 221 will be electrically connected with each second electric junction 281 while the first connector B and the second connector C are fastened together.

In another preferable embodiment of the present invention, the first circular board 22 and the second circular board 28 can be switched to be mounted on the second case 25 and the first case 20, as long as each first electric junction 221 is able to be electrically connected with each second electric junction 281 while the connector B and the connector C are fastened together The first substrate 10 and the second substrate 11 may be a plastic film, a fabric, a non-woven fabric or a cloth. The first connector B and the second connector C can be in any shapes that a button can be, like round shape or square shape where the circular board 22, 27 will be designed to correspond the shape of the connector B, C.

When using the present invention, the first substrate 10 may be a part of a cloth from smart clothing. The first wire module 23 of the first connector B is connected with a wire network set on the smart clothing. The second substrate 11 may be a part of a wearable electronic device. The second wire module 28 of the second connector C is connected with the wearable electronic device. After the first connector B on the smart clothing is fixed and connected with the second connector C on the wearable electronic device, the first wire module 23 is able to be electrically connected to the second wire module 28 and begin to function. The first ground wire 232 of the first connector B and the second ground wire 282 of the second connector C are able to quickly eliminate any outside interference providing a better and steadier signal transmitting function. Since the structure of the present invention is like a normal button on the clothing, it will be very easy to remove and will not affect the design or appearance of the clothing.

The above specification, examples, and data provide a complete description of the present disclosure and use of exemplary embodiments. Although various embodiments of the present disclosure have been described above with a certain degree of particularity, or with reference to one or more individual embodiments, those with ordinary skill in the art could make numerous alterations or modifications to the disclosed embodiments without departing from the spirit or scope of this disclosure.

What is claimed is:

1. A connector for clothing comprising:

a first substrate;

a first connector being mounted on the first substrate; wherein:

the first connector comprises a first conductive metallic case with a first bottom portion surrounded by an annular first side portion;

at least two first wire through holes are configured to the first side portion; wherein:

a first wire module comprising at least three first wires and at least one ground wire is configured to the first connector;

three first wires are passed through one of the first wire through hole and the ground wire is electrically connected with a surface of the first case;

a first circular board is configured inside but insulated from the first case; wherein:

at least three first electric junctions are electrically attached on a surface of the first circular board and each first wire is electrically connected with each first electric junction;

a second connector is mounted on a second substrate, and the second connector is removably and electrically attached with the first connector; wherein:

the second connector comprises a second conductive metallic case with a second bottom portion surrounded by annular second side portion;

at least one second wire through hole is configured to the second side portion;

a second wire module is configured to the second connector comprising at least three second wires and at least one second ground wire;

the at least three second wires are passed through the at least one second wire through hole and the at least one second ground wire is electrically connected with a surface of the second case;

a second circular board is configured to be placed inside but insulated from the second case;

at least three second electric junctions are configured to be attached on a surface of the second circular board;

each second wire of the second wire module is electrically connected with each second electric junction; and each first electric junction is electrically connected with each second electric junction while the first connector and the second connector are fastened together.

2. The connector as claimed in claim 1, wherein each first electric junction is a hook like metal film with elastic properties.

3. The connector as claimed in claim 1, wherein each first electric junction is an annular electric foil; and at least three annular electric foil are concentrically attached to the surface of the first circular board.

* * * * *